(12) United States Patent
Matthews

(10) Patent No.: US 9,632,162 B2
(45) Date of Patent: Apr. 25, 2017

(54) METHOD OF, AND APPARATUS FOR, CORRECTING DISTORTION IN MEDICAL IMAGES

(71) Applicant: TOSHIBA MEDICAL SYSTEMS CORPORATION, Otawara-shi (JP)

(72) Inventor: James Matthews, Edinburgh (GB)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 646 days.

(21) Appl. No.: 14/098,586

(22) Filed: Dec. 6, 2013

(65) Prior Publication Data
US 2015/0160322 A1 Jun. 11, 2015

(51) Int. Cl.
G01R 33/56 (2006.01)
G01R 33/565 (2006.01)
(Continued)

(52) U.S. Cl.
CPC . *G01R 33/56554* (2013.01); *G01R 33/56341* (2013.01); *G01R 33/5616* (2013.01); *G01R 33/56518* (2013.01); *G01R 33/56563* (2013.01)

(58) Field of Classification Search
CPC .......... G01R 33/56554; G01R 33/5616; G01R 33/56518; G01R 33/56563
See application file for complete search history.

(56) References Cited

U.S. PATENT DOCUMENTS 6,150,815 A * 11/2000 Janzen ............... B82Y 25/00
324/307
6,265,873 B1 * 7/2001 Le Roux ............ G01R 33/5615
324/307
(Continued)

FOREIGN PATENT DOCUMENTS

| JP | 2002-033960 | 1/2002 |
| JP | 2002-224083 | 8/2002 |
| JP | 2006-255046 | 9/2006 |

OTHER PUBLICATIONS

Comparison of EPI Distortion Correction Methods in Diffusion Tensor MRI Using a Novel Framework (Wu et al, 2008).*

(Continued)

*Primary Examiner* — Clayton E LaBalle
*Assistant Examiner* — Ruifeng Pu
(74) *Attorney, Agent, or Firm* — Nixon & Vanderhye P.C.

(57) ABSTRACT

An apparatus for correcting distortion in medical images comprises a data receiving unit for receiving first medical image data, second medical image data and third medical image data, wherein the first medical image data has a first distortion of a first distortion type and the second medical image data has the first distortion and a second distortion of a second distortion type wherein the first distortion and the second distortion are cumulative, a representation unit for determining a representation of the first type of distortion by comparing the first medical image data to third medical image data, and for determining a second representation of the second distortion in the absence of the first distortion, and an image correction unit for correcting the second type of distortion in the second medical image data using the representation of the first type of distortion and the representation of the second type of distortion.

18 Claims, 4 Drawing Sheets

(51) Int. Cl.
*G01R 33/563* (2006.01)
*G01R 33/561* (2006.01)

(56) References Cited

U.S. PATENT DOCUMENTS

| | | | | |
|---|---|---|---|---|
| 2010/0284595 | A1* | 11/2010 | Mori | G01R 33/56 |
| | | | | 382/131 |
| 2011/0304334 | A1* | 12/2011 | Feiweier | G01R 33/56518 |
| | | | | 324/314 |
| 2012/0259199 | A1* | 10/2012 | Huwer | G01R 33/56341 |
| | | | | 600/410 |
| 2012/0271583 | A1 | 10/2012 | Xu et al. | |
| 2013/0015855 | A1* | 1/2013 | Machii | A61B 5/055 |
| | | | | 324/307 |
| 2013/0249555 | A1* | 9/2013 | Chen | G01R 33/561 |
| | | | | 324/309 |
| 2013/0265045 | A1* | 10/2013 | Xu | G01R 33/56518 |
| | | | | 324/309 |
| 2013/0285653 | A1* | 10/2013 | Zhou | G01R 33/56572 |
| | | | | 324/307 |
| 2014/0002078 | A1* | 1/2014 | Chen | G01R 33/543 |
| | | | | 324/309 |
| 2014/0091793 | A1* | 4/2014 | Guo | G01R 33/5611 |
| | | | | 324/309 |
| 2014/0312897 | A1* | 10/2014 | Tan | G01R 33/56572 |
| | | | | 324/307 |
| 2015/0137813 | A1* | 5/2015 | Chenevert | G01R 33/56341 |
| | | | | 324/322 |
| 2015/0212181 | A1* | 7/2015 | Liu | G01R 33/56341 |
| | | | | 324/307 |

OTHER PUBLICATIONS

C. Poynton, M. Jenkinson, C. Pierpaoli, W. Well, Fieldmap-Free Retrospective Registration and Distorion Correction for EPI-based Diffusion-Weighted Imagin, Proc. Intl. Soc. Mag. Reson. Med. 17 (2009).*
Crum et al., "Information Theoretic Similarity Measures in Non-Rigid Registration", *Proceedings of IPMI* 2003, pp. 378-379.
CN Office Action in CN 201410738669.0 mailed Nov. 2, 2016.
Tao, G. et al., "The Correction of EPI-induced Geometric Distortions and Their Evaluation," IEEE, 2007, pp. 225-228.

* cited by examiner

| Option | Off-line calibration | Runtime | EPI correction quality | MPG correction quality | EPI image degradation | DWI image degradation |
|---|---|---|---|---|---|---|
| 1 | None | Moderate | None | Moderate | None | Low |
| 2 | None | Moderate | Good | None | Low | Low |
| 3 | None | Slow | Good | Moderate | Low | Low |
| 4 | Slow | Fast | None | Good | None | Low |
| 5 | Slow | Moderate | Good | Very good | Low | Moderate |
| 6 | Slow | Moderate | Good | Very good | Low | Low |

Fig. 4

METHOD OF, AND APPARATUS FOR, CORRECTING DISTORTION IN MEDICAL IMAGES

FIELD

Embodiments described herein relate generally to a method of, and apparatus for, correcting distortion in medical images. Embodiments have, for example, application to correcting motion-probing gradient distortion in diffusion-weighted magnetic resonance images.

BACKGROUND

Magnetic resonance imaging (MRI) is a well-known way of imaging the human body or other subject. In MRI, a strong magnetic field is applied to a subject causing precession of the protons in water molecules in the subject. Contrast between different tissues may be achieved by measuring the relaxation time of the precessing protons (T1 weighting) or by measuring the time that it takes the precessing protons to lose coherence (T2 weighting).

Diffusion-weighted imaging (DWI) is an MRI technique that is used to measure the diffusion of water in tissue. A DWI sequence uses two motion-probing gradient (MPG) pulses to selectively attenuate the signal of diffused fluid. The first MPG pulse is applied, resulting in dephasing of the proton spins. After a time interval, the second MPG pulse is applied. The second MPG pulse has the same magnitude as the first MPG pulse and may have the same direction or opposite direction to the first MPG pulse depending on the sequence. In a gradient-echo sequence, the direction of the second MPG pulse is opposite to the first MPG pulse. In a spin-echo sequence, the direction of the second MPG pulse is the same as the direction of the first MPG pulse.

If the water molecules have not moved during the interval between the first MPG pulse and the second MPG pulse, the second pulse compensates for the dephasing that resulted from the first pulse. However, if the molecules have diffused, then the dephasing is not fully compensated in protons that have moved. Water that has been diffused during the interval between pulses appears darker in the scan than water that has not been diffused. The attenuation is proportional to the amount of diffusion.

The degree of diffusion weighting achieved by the MPG pulses may be summarized in a single value, known as the b-value. The b-value depends on the acquisition parameters for the scan. Acquisition parameters include the gradient amplitude, the time at which the gradient is applied, and the time interval between the two MPG pulses. The higher the b-value, the greater the diffusion weighting.

An image resulting from a DWI scan will be diffusion-weighted, but may also exhibit T1 or T2 weighting. In order to separate out the effect of diffusion from the effect of T1 or T2 weighting, the DWI scan image may be compared with a reference image of the same subject for which b=0.

Most DWI sequences are based on echo-planar imaging (EPI). Echo-planar imaging is a technique that is used to produce rapid MRI images. Each radio-frequency excitation used in the MRI scan is followed by a train of gradient echoes. A scan image taken using EPI imaging with the addition of MPG pulses (a scan where b>0), may be compared with a scan image of the same subject that is taken using EPI imaging without MPG pulses. The image obtained from the scan with MPG pulses may be referred to as a DWI image. The image obtained from the scan without MPG pulses (a scan where b=0) may be referred to as an EPI image. The DWI image and EPI image may be compared to separate out the effect of diffusion.

To assess diffusion using a DWI image, the DWI image (b>0) and its corresponding EPI reference image (b=0) must be taken as part of the same series of scans. The series of scans may also include other MRI scan types, for example scans producing T2-weighted (T2W) images.

EPI and DWI images are subject to distortions, which may in some cases be substantial. Representative distortions are illustrated in FIGS. 1(a) and 1(b). T2W images are acquired using spin echo sequences and do not experience distortion of the types described below (EPI and MPG distortion).

Echo-planar imaging distortion (EPI distortion) is a type of geometric image distortion that may occur in both EPI and DWI images. EPI distortion is caused by inhomogeneity in the static field of the MRI scanner. The amount of EPI distortion may be different at different points of the EPI image, and the amount of distortion at each point may depend on the patient or subject being scanned.

FIG. 1(a) shows an image of a phantom (an object with known characteristics under MRI), where the image exhibits EPI distortion. In the image of FIG. 1(a), the phantom being imaged is an oil-based phantom having a shape resembling a flattened cylinder, roughly approximating the shape of a human torso. The grid of contrast lines that are visible in FIG. 1(a) are created by the MR hardware and are called saturation pulses. If there were no distortion, the contrast lines in the image would be parallel and perpendicular. In the image of FIG. 1(a), distortion is visible in the contrast lines. EPI images of different subjects may experience a different degree of distortion.

In addition to EPI distortion, DWI images may experience motion-probing gradient distortion (MPG distortion). MPG distortion is a type of geometric distortion that is caused by eddy currents that are induced by the MPG pulses in any conductive part of the scanner hardware, for example eddy currents that are induced in the gradient coils. MPG distortion is only present when MPG pulses are used. Therefore EPI images do not experience MPG distortion. The MPG distortion at each point in a DWI image may be a function of the position of that point in scanner equipment space (where scanner equipment space represents undistorted physical space, as opposed to the distorted space seen by the scanner before any correction). The amount of MPG distortion may not vary with different patients. However, the characteristics of MPG distortion may be specific to a particular scanner type, or specific to each individual scanner.

FIG. 1(b) shows an image of the phantom of FIG. 1(a) that exhibits both EPI and MPG distortion. In addition to the EPI distortion, the MPG distortion in the example of FIG. 1(b) results in a saddle-shaped distortion of the image.

A number of methods have been proposed for correcting EPI distortion. Most methods fall into two categories, field map methods and registration methods. Field map methods obtain EPI images with multiple echo times, and use the images to compute the amount of EPI distortion. Field map methods can be applied to correct EPI distortion in novel images. Given an set of images of the same anatomy with different echo times, it is possible to calculate the EPI distortion and correct all the images. However, field map methods may not apply to MPG distortion.

Registration methods align novel EPI images directly with a non-EPI reference image, for example T2W. T2W is chosen as a reference image because T2W images do not experience EPI or MPG distortion. Registration methods can correct for both MPG distortion and EPI distortion if they are robust enough to handle both EPI-T2W and DWI-T2W registration reliably. However, if either registration is inaccurate, then both types of distortion may be badly corrected.

BRIEF DESCRIPTION OF THE DRAWINGS

Embodiments are now described, by way of non-limiting example, and are illustrated in the following figures, in which:

FIG. 4 is a table comparing possible methods of correcting image distortions.

DETAILED DESCRIPTION

Certain embodiments provide an apparatus for correcting distortion in medical images, the apparatus comprising a data receiving unit for receiving first medical image data having a first distortion of a first distortion type and second medical image data having the first type of distortion and a second distortion of a second distortion type, wherein the first distortion and the second distortion are cumulative. The apparatus further comprises a representation unit for determining a representation of the first distortion by comparing the first medical image data to third medical image data and for determining a representation of the second distortion in the absence of the first distortion. The apparatus also comprises an image correction unit for correcting the second distortion in the second medical image data using the representation of the first distortion and the representation of the second distortion.

Figure 1A:
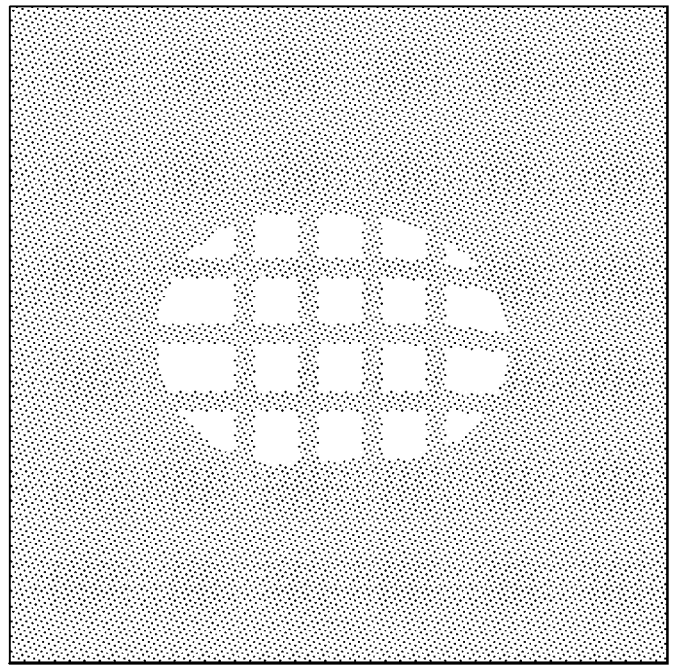
FIG. 1(a) and FIG. 1(b) are images exhibiting geometric distortions.
Figure 1B:
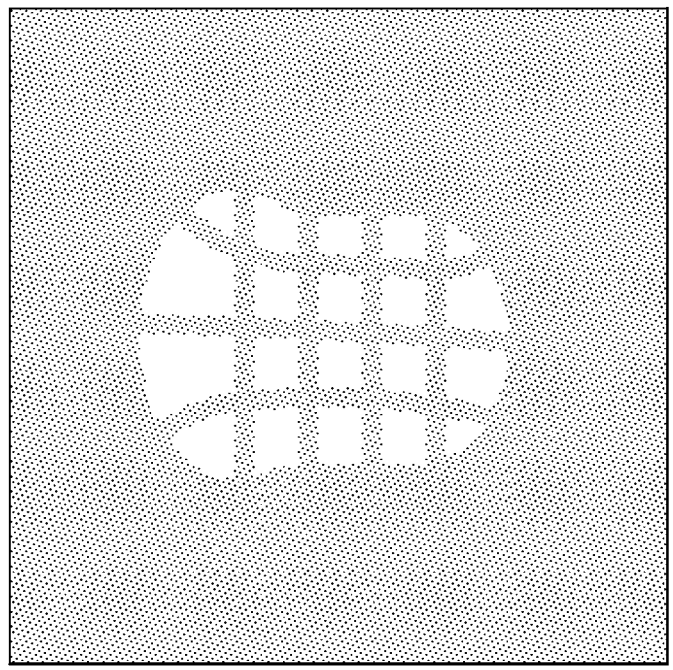
Figure 2:
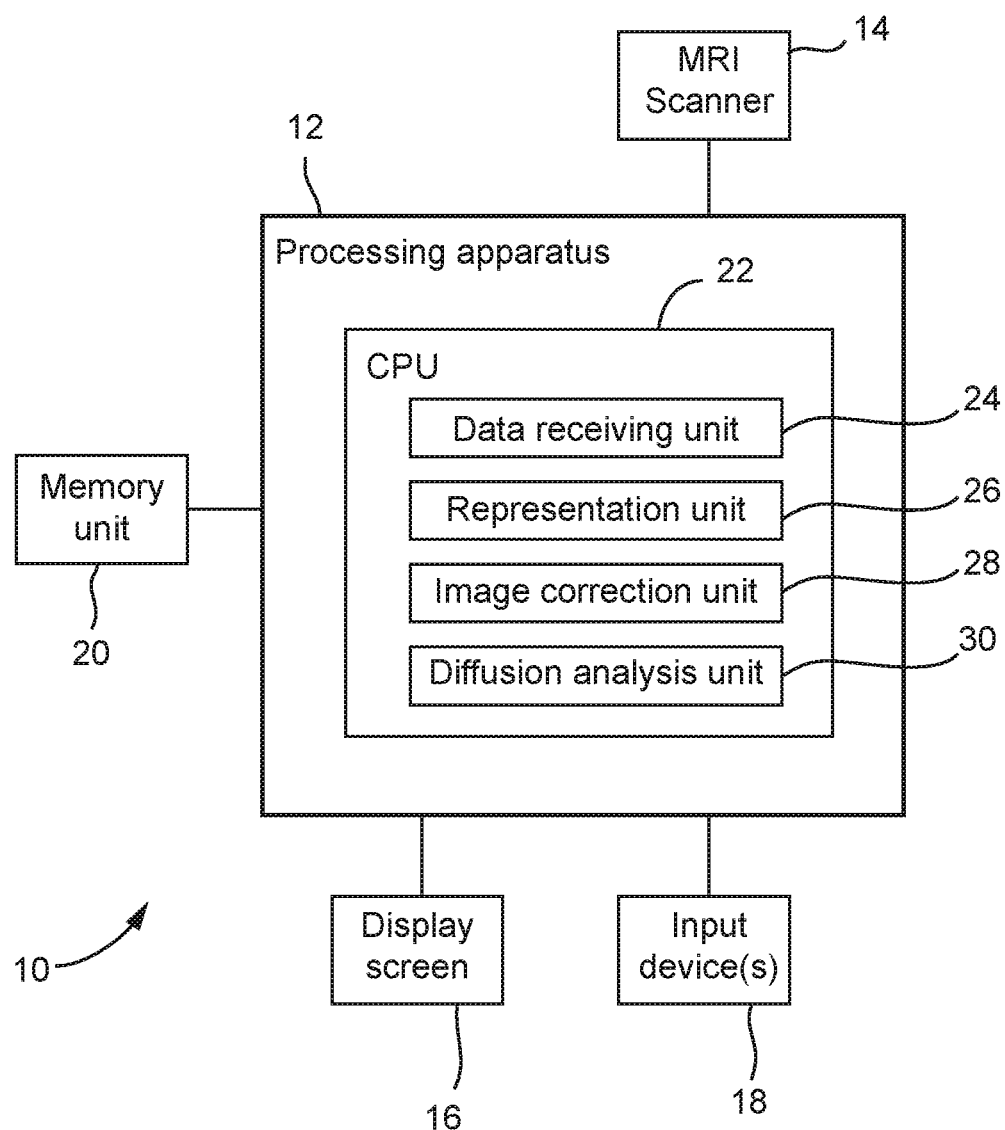
FIG. 2 is a schematic diagram of a system according to an embodiment.

An apparatus 10 according to a first embodiment is illustrated schematically in FIG. 2.

The apparatus 10 comprises a processing apparatus 12. In the current embodiment, the processing apparatus 12 is a console attached to an MRI scanner 14. In other embodiments, the processing apparatus 12 may be, for example, a standalone or networked personal computer (PC). In further embodiments, the processing apparatus 12 may be part of the MRI scanner 14. In the present embodiment, the MRI scanner 14 is a Toshiba Vantage (RTM) scanner with a QD whole body coil, although in alternative embodiments any suitable scanner may be used.

The processing apparatus 12 is connected to a display screen 16 and an input device or devices 18, such as a computer keyboard, mouse or control panel.

In the present embodiment, sets of image data acquired by the MRI scanner 14 are stored in memory unit 20 and subsequently provided to the processing apparatus 12. In an alternative embodiment, sets of image data are supplied from a remote data store (not shown) which may form part of a Picture Archiving and Communication system (PACS). The memory unit 20 or remote data store may comprise any suitable form of memory storage.

The processing apparatus 12 provides a processing resource for automatically or semi-automatically processing sets of image data. It comprises a central processing unit (CPU) 22 that is operable to load and execute a variety of software modules or other software components that are configured to perform the method described below with reference to FIG. 3.

The processing apparatus 12 includes a data receiving unit 24 for receiving image data from the memory unit 20 or remote data store, a representation unit 26 for creating representations of first and second distortions that may be present in images represented by sets of image data, and an image correction unit 28 for correcting the distortions in the sets of image data. In the present embodiment, the processing apparatus 12 also includes a diffusion analysis unit 30.

In the embodiment of FIG. 2, the data receiving unit 24, representation unit 26, image correction unit 28 and diffusion analysis unit 30 are each implemented in the central processing unit 22 by means of a computer program having computer-readable instructions that are executable to perform the method of the embodiment. However, in other embodiments, each unit may be implemented in software, in hardware, or in any suitable combination of hardware and software. In some embodiments, the various units may be implemented as one or more ASICs (application specific integrated circuits) or FPGAs (field programmable gate arrays) or any other pre-programmed or programmable logic devices.

The processing apparatus 12 also includes a hard drive and other components including RAM, ROM, a data bus, an operating system including various device drivers and hardware devices including a graphics card. Such components are not shown in FIG. 2 for clarity.

Figure 3:
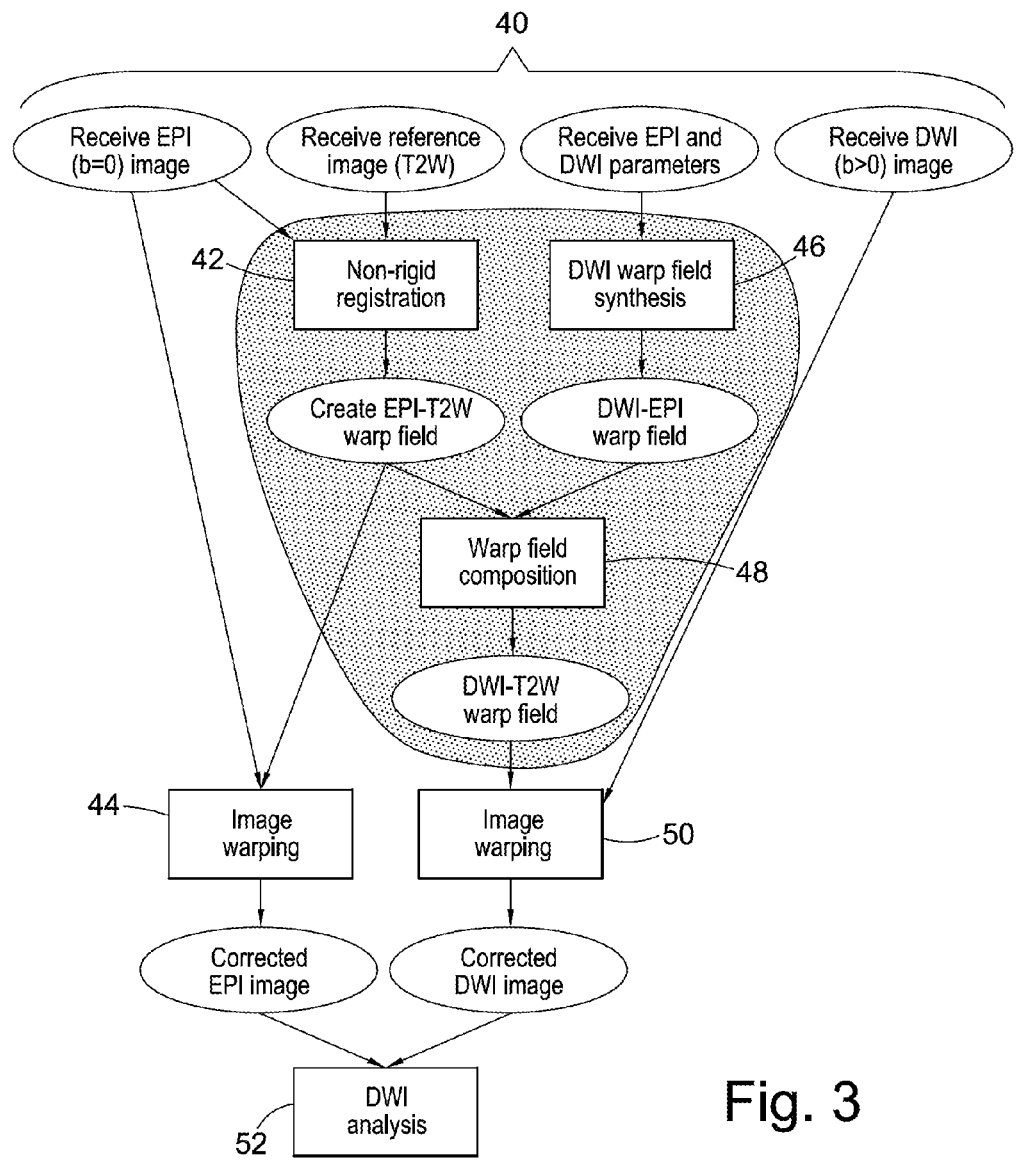
FIG. 3 is a flow chart illustrating in overview a mode of operation of the embodiment of FIG. 2.

The system of FIG. 2 is configured to perform a process having a series of stages as illustrated in overview in the flow chart of FIG. 3.

At stage 40, the data receiving unit 24 receives from memory unit 20 a set of image data representing a DWI (b>0) image, a set of image data representing an EPI (b=0) image, a set of image data representing a reference T2W image, and a set of parameters relating to the acquisition of the DWI image. In alternative embodiments, some or all of the DWI image data, EPI image data, T2W image data and DWI acquisition parameters are obtained directly from the MRI scanner 14, from a remote data store, or from any other appropriate data storage component or device.

The DWI acquisition parameters may include parameters relating to the strength or duration of the MPG pulses performed in the DWI scan, the time interval between the MPG pulses, the echo train spacing (the time between echoes in the EPI sequence), the b-value of the scan, the make, model or serial number of the MR scanner 14, the configuration of any parallel imaging technology used (for example Toshiba's SPEEDER) or any other parameters relating to the scan setup.

The DWI image data, EPI image data and T2W image data all relate to the same region of the same patient or subject (for example, the brain of a patient) and are taken using the same scanner 14. In the present embodiment, the scan resulting in the DWI image data, the scan resulting in the EPI image data and the scan resulting in the T2W image data are all acquired in one study (Programmable Anatomical Scan). It is not required to execute an additional scan for T2W that is separate to the acquisition of the EPI and DWI images.

The EPI image and the DWI image represented by the data exhibit EPI distortion, the DWI image additionally exhibits MPG distortion, and the T2W image exhibits neither EPI nor MPG distortion.

In alternative embodiments, instead of image data relating to a T2W image, the data receiving unit 24 receives image data relating to another type of MRI image, for example a T1-weighted image. Any appropriate image data that represents the correct anatomical region, does not exhibit EPI distortion and does not exhibit MPG distortion may be used.

At stage 42, the representation unit 26 receives the EPI image data and the T2W image data from the data receiving unit 24 and registers the EPI image data and the T2W image data using any suitable form of registration, which may be non-rigid registration. The representation unit 26 thereby determines a representation of the EPI distortion.

Methods of registration are well known. In the present embodiment, the representation unit 26 registers the EPI image data and the T2W image data based on intensity values. The registration procedure uses Mutual Information as a similarity measurement and a non-rigid warp field is computed using the Crum-Hill-Hawkes scheme (William R. Crum, Derek L. G. Hill, David J. Hawkes. Information Theoretic Similarity Measures in Non-rigid Registration, Proceedings of IPMI'2003, pp. 378-387). Any other suitable registration procedure may be used in alternative embodiments.

In the present embodiment, the representation unit 26 registers the EPI image data to the T2W image data. In other embodiments, the T2W image data is registered to the EPI image data. In further embodiments, the image data to which the EPI image data is registered is T1W image data or any other suitable image data. In the present embodiment, the representation of the EPI distortion is a warp field. In other embodiments, other representations may be used.

The warp field that is computed from the non-rigid registration may be called an EPI-T2W warp field. The EPI-T2W warp field maps each point on the EPI image to its equivalent point on the T2W image. The EPI-T2W warp field comprises a transformation vector for each pixel.

At stage 44, the image correction unit 28 uses the EPI-T2W warp field to transform the EPI image data. For each pixel in the final image, the image correction unit 28 looks up an offset in the warp field, and uses that to determine a location in the source image. It then fetches the source image value at that location, interpolating if necessary, and places it in the final image.

Since the T2W image does not experience geometric distortions, and particularly does not exhibit EPI distortion, transforming the EPI image data using the EPI-T2W warp results in a correction, or partial correction, of the EPI distortion in the EPI image data. The transformed EPI image data may be referred to as corrected EPI image data. The degree of correction of the EPI distortion of the EPI image data is dependent on the quality of the EPI-T2W registration.

Unlike EPI distortion, MPG distortion may be not dependent on the individual patient or subject being scanned and instead be dependent only on the scanner being used and the acquisition parameters (for example, the b-value and the time interval between pulses). Therefore it is possible to create a model of the MPG distortion that is a function of the acquisition parameters. Such a model may estimate the MPG distortion at each point in scanner equipment space for any given set of acquisition parameters. In the present embodiment, an MPG distortion model for the MRI scanner 14 is generated using an offline calibration process based on registration of phantom data. In the present embodiment, the calibration process is performed at the installation and the resulting distortion model is stored in memory 20. Recalibration of the MPG distortion model for the MRI scanner 14 may not be required unless the hardware is changed. In other embodiments, the distortion model may be calibrated at different intervals.

The calibration process comprises measuring a phantom, for example an oil phantom, for numerous settings and b-values. For each b-value, several measurements of the phantom may be made, with other settings varied for each measurement. For example, a number of measurements of the phantom may be made at each b-value, with the parallel imaging configuration varied between measurements. Multiple registrations are made between a DWI phantom image and an EPI phantom image. The measurement data from the measurements of the phantom is then fitted to obtain calibration parameters. In the present embodiment, the MPG distortion model comprises around 100 parameters, where most of the parameters define a sparse warp field and other parameters comprise acquisition parameters. In other embodiments, the MPG distortion model may be parameterized differently. In further embodiments, a different method of calibration of the distortion model may be used.

At stage 46, the representation unit 26 receives the MPG distortion model relating to the MRI scanner 14 from the memory 20. In other embodiments, the representation unit 26 retrieves the MPG distortion model from the MRI scanner 14 or from any appropriate local or remote storage. In further embodiments, where the DWI image data was not taken on MRI scanner 14, the representation unit 26 retrieves an MPG distortion model associated with the MRI scanner on which the DWI scan was performed.

The representation unit 26 receives the DWI acquisition parameters from the data receiving unit 24. In other embodiments, the representation unit 26 receives the DWI acquisition parameters directly from the MRI scanner 14, or from an alternative data store. The DWI acquisition parameters may comprise data relating to the scanner model (or individual scanner) used for the acquisition of the DWI image data, the gradients, times and time intervals used in the DWI scan, or any other relevant data.

The representation unit 26 applies the DWI acquisition parameters for the DWI scan to the MPG distortion model for the MRI scanner 14, and uses the model to perform warp field synthesis to create a DWI-EPI warp field. The DWI-EPI warp field may be described as a representation of the MPG distortion. The DWI-EPI warp field relates points in the DWI image data to points in the EPI image data by using the distortion model to estimate the MPG distortion at each point in the DWI image data.

Model-based MPG distortion correction attempts to estimate the amount of MPG distortion at each point in the DWI (b>0) image. For accurate modeling, it is required that each point in the reference (b=0) image corresponds to a fixed location in scanner equipment space. However, since the EPI distortion can be patient-dependent, each point does not correspond to a fixed location unless the EPI distortion is corrected. The EPI distortion is cumulative on the MPG distortion. Thus, the effects of the two distortions may be considered not to be independent. For example, the effects of the EPI distortion may be taken as acting on an image that has already been distorted by the MPG distortion. Therefore to achieve more accurate MPG distortion correction using the MPG distortion model, it is necessary also to account for EPI distortion. Correction of the EPI distortion is required in order to accurately correct the MPG distortion.

In the present embodiment, model-based correction is performed on a per-image (per-slice) basis rather than on a per-volume basis, although the correction may be performed on a per-volume basis or in any other suitable fashion in alternative embodiments.

In other embodiments, different representations of the MPG distortion may be used. In each case, the representation of the MPG distortion is obtained in the absence of the EPI distortion.

At stage 48, the image correction unit 28 obtains the EPI-T2W warp field and the DWI-EPI warp field from the representation unit 26. The image correction unit 28 composes the EPI-T2W warp field and the DWI-EPI warp field to create a combined warp field. The order of the composition is such that the combined warp field corrects the EPI distortion (using the EPI-T2W warp field) before correcting the MPG distortion (using the DWI-EPI warp field).

At stage 50, the image correction unit 28 uses the combined warp field to transform the DWI image data. For each pixel in the final image, the image correction unit 28 looks up an offset in the warp field, and uses that to determine a location in the source image. It then fetches the source image value at that location, interpolating if necessary, and places it in the final image. The transformed image data may be referred to as corrected DWI image data.

In an alternative embodiment, the DWI-EPI warp field and the EPI-T2W warp field are not composed into a single combined warp field (stage 48 is omitted). Instead, at stage 50, the image correction unit 28 applies first the EPI-T2W warp field and then the DWI-EPI warp field to the DWI image data. Performing two separate warps requires that the image data is resampled twice. In the case of the combined warp field, the image data only needs to be resampled once and therefore performing a single warp with the combined warp field results in less degradation of the image data than performing two successive warps with the two individual warp fields.

At stage 52, the diffusion analysis unit 30 conducts DWI analysis on the corrected EPI image data and the corrected DWI image data. The diffusion analysis unit 30 compares the corrected DWI image data to the corrected EPI image data to assess the diffusion that occurred during the interval between the MPG pulses.

To improve accuracy of MPG distortion correction, it is necessary to account for EPI distortion. If an MPG distortion model were applied to image data in which the EPI distortion had not been corrected, it would be less accurate in correcting the MPG distortion than in the case where the EPI distortion had been corrected. This is because the MPG distortion model estimates the MPG distortion for particular points in scanner equipment space, which cannot be known if the EPI distortion correction is not known.

Therefore correcting EPI distortion in combination with correcting MPG distortion may provide better correction of the MPG distortion than if the MPG distortion correction was performed without any EPI distortion correction.

An alternative method of correcting EPI and MPG distortion may be to use a registration method. In one such registration method, the EPI image data is registered to the T2W image data in a first registration, and the DWI image data is registered to the T2W image data in a second registration. If either registration is inaccurate, then both types of distortion are badly corrected. In practice, registration methods may not be completely reliable. Errors from the two registrations may be compounded, leading to both residual EPI distortion and errors in DWI analysis.

In the embodiment of FIG. 3, two distinct distortion correction methods are used. The distortion correction method for EPI distortion may be chosen separately from the distortion correction method for MPG distortion. The use of two separate distortion methods means that it may be possible to choose the best available method for correcting each type of distortion.

It is particularly important to have reliable MPG distortion correction, so that images are well aligned for DWI analysis. The embodiment of FIG. 3 still offers good MPG distortion correction even in cases where the EPI distortion correction is poor. The embodiment of FIG. 3 may give smaller DWI analysis errors than solely a registration method, even if poor EPI-T2W registration results in some residual EPI distortion.

The embodiment of FIG. 3 requires only registration of EPI image data to T2W image data, which may be easier and more reliable than DWI to T2W registration or DWI to EPI registration.

Non-rigid registration may also be much slower than warp field synthesis, such as the warp field synthesis of stage 46. The embodiment of FIG. 3 includes only one registration, the EPI-T2W registration of stage 42. Only the correction of the EPI distortion is performed by registration. The correction of the MPG distortion is instead performed by the warp field synthesis of stage 46, based on the MPG distortion model. Therefore a method according to the embodiment of FIG. 3 may be almost twice as fast as a method that uses two registrations (for example, an EPI-T2W registration and a DWI-T2W registration).

Including the stage of composing the warp field may result in less image degradation than if an EPI-T2W warp field (EPI distortion correction) and a DWI-EPI warp field (MPG distortion correction) were applied sequentially. Since image warping necessarily involves resampling, the quality of the DWI image may be degraded more than necessary if two separate warps are carried out and therefore the DWI image is degraded by two separate resampling steps. The embodiment of FIG. 3 combines the two warp fields in advance so that only one warping step is required.

In an alternative embodiment, only the MPG distortion in the DWI image data is corrected. At stage 40, the data receiving unit receives EPI image data, T2W image data, DWI acquisition parameters and DWI image data. At stage 42, the representation unit 26 performs a non-rigid registration of the EPI image data and the T2W image data and creates an EPI-T2W warp field from the result of the registration. In this embodiment, the representation unit 26 also calculates the inverse of the EPI-T2W warp field. Stage 44 is omitted. At stage 46, the representation unit 26 applies the DWI acquisition parameters to the MPG distortion model relating to the MRI scanner 14 (or the scanner with which the scans were taken, if different) and synthesizes a DWI-EPI warp field from the MPG distortion model. At stage 48, the image correction unit 28 composes three warp fields: the EPI-T2W warp field, the DWI-EPI warp field and the inverse EPI-T2W warp field. At stage 50, the image correction unit 28 applies the composed warp field to the DWI image data. The application of the composed warp field to the DWI image data has the effect of correcting the MPG image distortion only, leaving the EPI distortion. The correction is effectively achieved by correcting the EPI distortion, correcting the MPG distortion and then reversing the correction of the EPI distortion.

At stage 52, the diffusion analysis unit carries out DWI analysis on the EPI image (with uncorrected EPI distortion) and the DWI image (in which only the MPG distortion has been corrected).

There are many possible combinations of registration steps and warp field synthesis that may in principle be used to attempt to correct EPI distortion, MPG distortion, or both EPI and MPG distortion. The table of FIG. 4 compares several possible combinations on a theoretical basis by using certain assumptions about the distortion correction methods. Using different assumptions may result in different conclusions.

In the table of FIG. 4. each of the combinations is assessed for whether calibration is required, the likely runtime of the method, the quality of the EPI distortion correction, the quality of the MPG distortion correction, the degradation of the EPI image and the degradation of the DWI image.

Combination 1 comprises a DWI-EPI registration only. Combination 1 performs MPG distortion correction only, with no way of correcting EPI distortion. No offline calibration is required and the runtime may be moderate. There is no EPI correction and the quality of the MPG correction may be described as moderate. The EPI image is not degraded because no change is made to the EPI image. The degradation of the DWI image data is low because the DWI image data experiences one warp resulting from a warp field generated by the DWI-EPI registration and therefore one resampling.

Combination 2 comprises an EPI-T2W registration. A warp field derived from the EPI-T2W registration is applied to both the EPI image data and the DWI image data. Combination 2 performs EPI distortion correction only, without MPG distortion correction. No offline calibration is used, and the runtime of the method may be moderate. The EPI distortion correction is good but there is no MPG distortion correction. The degradation of each image is low because each image undergoes one resembling.

Combination 3 is the registration method described above, where both EPI-T2W and DWI-T2W registration are performed. No offline calibration is required. The runtime may be slow, as each registration requires a substantial amount of time. It is expected that the EPI distortion correction will be good. However, the MPG distortion correction quality is expected to be moderate, because it is expected that DWI-EPI registration will be hard compared with EPI-T2W registration because of the image attenuation in the DWI scan. Therefore, the correction achieved by DWI-EPI registration may be less accurate than one based on EPI-T2W registration. Both the EPI image and the DWI image may have a low degree of image degradation since each image undergoes one resampling.

Other combinations of various types of correction involving registration are also possible but are omitted from FIG. 4 because they have similar advantages and disadvantages to combinations that are already present. For example, one such combination involves applying a DWI-EPI registration result and an EPI-T2W registration result sequentially to the DWI image. Another combination involves composing a warp field derived from a DWI-EPI registration with a warp field derived from an EPI-T2W registration and then applying the composed warp field to the DWI image.

Combination 4 comprises a synthesized DWI-EPI warp field only. Here the synthesis step may be the same as the synthesis of stage 46 of FIG. 3, but it is not combined with any EPI distortion correction. An offline calibration is performed, which requires multiple measurements and therefore is likely to be slow. The runtime of combination 4 is fast because it comprises only synthesizing a warp field from a distortion model, which is expected to be considerably faster than a registration. The EPI distortion is not corrected. The MPG distortion correction quality is expected to be good. The EPI image is not degraded and the DWI image has a low degree of degradation because the DWI image undergoes one resampling.

Combination 5 uses an EPI-T2W registration and a synthesized DWI-EPI warp field. Combination 5 is an embodiment where the process of FIG. 3 is altered by omitting the warp field composition and instead applying the EPI-T2W warp field and the DWI-EPI warp field sequentially to the DWI image data. The warp field resulting from the EPI-T2W registration is also applied to the EPI image data. Offline calibration is required for the MPG distortion model that supplies the synthesized DWI-EPI warp field. The runtime is moderate, since the method includes one registration and one warp field synthesis, where warp field synthesis is much quicker than registration. The EPI correction quality is likely to be good. The MPG distortion correction quality is likely to be very good. The MPG correction quality is dependent on the EPI distortion correction. The EPI distortion should be well corrected before the MPG distortion correction is applied, improving the MPG distortion correction over what would be achieved if the EPI was not corrected. There is likely to be a low degree of degradation of the EPI image because the EPI image undergoes one resampling. However, since two separate warps are applied to the DWI image data, the DWI image undergoes two resampling steps and so may experience moderate (rather than low) degradation due to being resampled twice.

Combination 6 corresponds to the embodiment of FIG. 3. The EPI image data and T2W image data are registered. The EPI distortion in the EPI image data is corrected using the EPI-T2W registration. The MPG and EPI distortions in the DWI image data are corrected using a composed warp field that is obtained by composing the EPI-T2W warp field with a DWI-EPI warp field synthesized from an MPG distortion model. The offline calibration is slow and the runtime is moderate. Good EPI distortion correction and very good MPG distortion correction are likely to be achieved, with low degradation of the EPI image. By combining the warp fields into a composed warp field, there is likely to be low degradation of the DWI image quality, since the DWI image is only resampled once.

The above embodiments refer to DWI and EPI images, and to MPG and EPI distortion. However, the distortion correction method above may be applied to any images where the correction of one type of distortion is dependent on the correction of another type of distortion. In the above embodiments, MPG distortion was corrected in dependence on the correction of EPI distortion. In further embodiments, MPG and EPI distortions may be corrected in images other than DWI and EPI images. In other embodiments, different distortions may be corrected in any type of MRI images that experience a first distortion and a second distortion, where the correction of the second distortion is dependent on the correction of the first distortion. Possible applications may include flow-dependent angiography methods, such as time-of-flight or phase-contrast, especially if there are any subsequent processing steps that compare the images with a conventional scan.

Some embodiments provide a method for simultaneous correction of two types of distortion in medical images, comprising estimating a first type of distortion, between a first pair of images, estimating a second type of distortion, between a third image and one of the first pair of images, in which the accuracy of estimation is conditional on accurate correction of the first type of distortion. The first type of distortion may comprise EPI distortion between a T2-weighted and an echo-planar MRI image. The second type of distortion may comprise MPG distortion between said echo-planar image and a third diffusion-weighted MRI image.

The above embodiments are implemented on a processing apparatus 12 that is a console attached to an MRI scanner 14. This is because calibration of the MPG distortion model is likely to be specific to the scanner model, or even to the individual device. There may also be difficulties in obtaining all of the necessary EPI and DWI acquisition parameters in a standalone system, because the EPI and DWI parameters are not all available from standard DICOM files in a consistent way. However, in alternative embodiments the processing apparatus 12 may be a standalone device, for example a PC, as long as acquisition parameters are captured from the MRI scanner 14 in a form that is suitable for delivery to the processing apparatus 12.

Image data having a type of distortion may be image data that represents an image that is distorted by that type of distortion.

Whilst particular units have been described herein, in alternative embodiments functionality of one or more of these units can be provided by a single unit, processing resource or other component, or functionality provided by a single unit can be provided by two or more units or other components in combination. Reference to a single unit encompasses multiple components providing the functionality of that unit, whether or not such components are remote from one another, and reference to multiple units encompasses a single component providing the functionality of these units.

While certain embodiments have been described, these embodiments have been presented by way of example only, and are not intended to limit the scope of the invention. Indeed the novel methods and systems described herein may be embodied in a variety of other form. Furthermore, various omissions, substitutions and changes in the form of the methods and systems described herein may be made without departing from the spirit of the invention. The accompanying claims and their equivalents are intended to cover such forms and modifications as would fall within the scope of the invention.

The invention claimed is:

1. An apparatus for correcting distortion in medical images, comprising processing circuitry configured to:
receive echo-planar image data (EPI image data), diffusion-weighted image data (DWI image data) and further medical image data, wherein the EPI image data and the DWI image data are generated by magnetic resonance imaging (MRI) scanning, wherein the EPI image data has an echo-planar imaging distortion (EPI distortion) and the DWI image data has the EPI distortion and a motion-probing gradient distortion (MPG distortion), wherein the EPI distortion and the MPG distortion are cumulative;
determine a representation of the EPI distortion by comparing the EPI image data to the further medical image data, and determine a representation of the MPG distortion in the absence of the EPI distortion;
correct the MPG distortion in the DWI image data using the representation of the EPI distortion and the representation of the MPG distortion; and
display or store the corrected DWI image data.

2. An apparatus according to claim 1, wherein the representation of the MPG distortion is based on a distortion model.

3. An apparatus according to claim 1, wherein correcting the MPG distortion in the DWI image data comprises transforming the DWI image data with a transform comprising a combination of a first transform derived from the representation of the EPI distortion and a second transform derived from the representation of the MPG distortion.

4. An apparatus according to claim 3, wherein the first transform comprises a first warp field and the second transform comprises a second warp field, and wherein the combination of the first transform and the second transform comprises a composition of the first warp field and the second warp field.

5. An apparatus according to claim 1, wherein correcting the MPG distortion in the DWI image data comprises transforming the DWI image data with a first transform derived from the representation of the EPI distortion, then transforming the resulting image data with a second transform derived from the representation of the MPG distortion.

6. An apparatus according to claim 5, wherein the first transform comprises a first warp field and the second transform comprises a second warp field.

7. An apparatus according to claim 1 wherein each of the EPI image data, DWI image data and further medical image data comprises magnetic resonance (MR) image data.

8. An apparatus according to claim 1, wherein the processing circuitry is further configured to analyze fluid diffusion in the subject of the DWI image data by comparing the DWI image data to the EPI image data.

9. An apparatus according to claim 1, wherein the image correction unit is further configured to correct the first distortion in the first medical image data using the determined representation of the first distortion.

10. An apparatus according to claim 1, wherein the processing circuitry is further configured to correct the EPI distortion in the DWI image data using the determined representation of the EPI distortion.

11. An apparatus according to claim 10, wherein the accuracy of the correction of the MPG distortion in the DWI image data is dependent on the accuracy of the correction of the EPI distortion in the DWI image data.

12. An apparatus according to claim 1, wherein comparing the EPI image data to the further medical image data comprises registering the EPI image data and the further medical image data.

13. An apparatus according to claim 12 wherein registering the EPI image data and the further medical image data comprises non-rigid registration.

14. An apparatus according to claim 2 wherein the distortion model is obtained from a distortion model calibration process, the distortion model calibration process comprising multiple measurements of a known object.

15. An apparatus according to claim 14 wherein the multiple measurements of the known object comprise a plurality of measurements each with a different b-value.

16. An apparatus according claim 14 wherein the multiple measurements of the known object comprise, for each of a plurality of b-values, several measurements at the b-value, wherein the several measurements differ by the adjustment of at least one scan parameter.

17. An apparatus according to claim 1 wherein the EPI distortion is dependent on the subject of the EPI image data and the DWI image data, and may differ with different subjects, and wherein the MPG distortion is independent of the subject of the DWI image.

18. A method for correcting distortion in medical images, comprising:
receiving echo-planar imaging image data (EPI image data), diffusion-weighted image data (DWI image data) and further medical image data, wherein the EPI image data and the DWI image data are generated by magnetic resonance imaging (MRI) scanning, wherein the EPI image data has a echo-planar imaging distortion (EPI distortion) and the DWI image data has the EPI distortion and a motion-probing gradient distortion (MPG distortion), wherein the EPI distortion and the MPG distortion are cumulative;

determining a representation of the EPI distortion by comparing the EPI image data to the further medical image data, and determining a representation of the MPG distortion in the absence of the EPG distortion;
correcting the MPG distortion in the DWI image data using the representation of the EPI distortion and the representation of the MPG distortion; and
display or store the corrected DWI image data.

\* \* \* \* \*